United States Patent
Liu et al.

(10) Patent No.: US 11,011,230 B1
(45) Date of Patent: May 18, 2021

(54) MEMORY DEVICE AND OPERATION METHOD THEREOF

(71) Applicant: Winbond Electronics Corp., Taichung (TW)

(72) Inventors: Chia-Ming Liu, Kaohsiung (TW); Ming-Che Lin, Taichung (TW); Bo-Lun Wu, Tianzhong Township (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/830,718

(22) Filed: Mar. 26, 2020

(51) Int. Cl.
*G11C 16/04* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 2013/0045* (2013.01); *G11C 2013/0078* (2013.01); *G11C 2213/79* (2013.01)

(58) Field of Classification Search
CPC .............. G11C 13/0069; G11C 13/003; G11C 13/004; G11C 2013/0045
USPC ........................................................ 365/148
See application file for complete search history.

(56) References Cited

U.S. PATENT DOCUMENTS

| 8,189,363 | B2 | 5/2012 | Tsuchida et al. | |
|---|---|---|---|---|
| 9,093,145 | B2 | 7/2015 | Oh et al. | |
| 2008/0062740 | A1 | 3/2008 | Baek et al. | |
| 2008/0205119 | A1* | 8/2008 | Nagai | G11C 11/16 365/148 |
| 2011/0058414 | A1* | 3/2011 | Ho | G11C 11/56 365/185.03 |
| 2012/0147664 | A1* | 6/2012 | Rho | G11C 11/1697 365/158 |

* cited by examiner

*Primary Examiner* — Vu A Le
(74) *Attorney, Agent, or Firm* — Birch, Stewart, Kolasch & Birch, LLP

(57) ABSTRACT

A memory device includes a memory array, a first reference unit, a second reference unit, and a control unit. The memory array includes a plurality of memory cells. The first reference unit provides a first reference current. The second reference unit provides a second reference current, wherein a current value of the first reference current is less than a current value of the second reference current. In a data-writing operation, the control unit provides a first current to a memory cell, reads a second current generated by the memory cell in response to the first current, and selects to compare the second current with the first reference current or to compare the second current with the second reference current according to a data-writing state of the memory cell, so as to determine whether a data writing of the data writing state is successful.

14 Claims, 5 Drawing Sheets

MEMORY DEVICE AND OPERATION METHOD THEREOF

BACKGROUND OF THE INVENTION

Field of the Invention

An embodiment of the present invention relates to a memory, and in particular it relates to a memory device and an operation method thereof.

Description of the Related Art

Generally, after data is written into a memory cell, the current of the memory may be read by a sensing circuit. Then, the above current is compared with a predetermined current to determine whether the data writing of the memory cell was successful. However, when the sensing window formed by the above current and the predetermined current is narrow, it is easy to cause misjudgment and reduce the reliability of confirming the memory cell.

In order to improve the situation in which a narrow sensing window results in reduced reliability, an architecture having two transistors and two resistors (2T2R) may be used to store a single bit. Accordingly, the margin of the sensing window (formed by the current of the memory cell and the reference current) may be increased and the reliability of the memory may be improved. However, the above design may reduce the storage capacity of the memory. Therefore, the design of the memory still needs to be improved.

BRIEF SUMMARY OF THE INVENTION

The present invention provides a memory device and an operation method thereof, thereby effectively increasing the reliability and accuracy of the memory.

An embodiment of the present invention provides a memory device, which includes a memory array, a first reference unit, a second reference unit and a control unit. The memory array includes a plurality of memory cells. The first reference unit provides a first reference current. The second reference unit provides a second reference current, wherein a current value of the first reference current is less than a current value of the second reference current. The control unit is coupled to the memory cells, the first reference unit and the second reference unit. In a data-writing operation, the control unit provides a first current to a memory cell, reads a second current generated by the memory cell in response to the first current, and selects to compare the second current with the first reference current or to compare the second current with the second reference current according to the data-writing state of the memory cell, so as to determine whether a data writing of the data writing state is successful.

The present invention provides an operation method of a memory device, which includes the following steps. A memory array having a plurality of memory cells is provided. A first reference unit for providing a first reference current is provided. A second reference unit for providing a second reference current is provided, wherein a current value of the first reference unit is less than a current value of the second reference unit. In a data-writing operation, a first current is provided to a memory cell, and a second current generated by the memory cell in response to the first current is read. It is selected to compare the second current with the first reference current or to compare the second current with the second reference current according to a data-writing state of the memory cell, so as to determine whether a data writing of the data writing state is successful.

According to the memory device and the operation method thereof disclosed by the embodiment of the present invention, the different reference currents may be selected according to the data-writing state of the memory cell, so as to determine whether the data writing of the data writing state is successful. Therefore, the reliability and accuracy of the memory may be effectively increased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents the same or similar element or component.

Figure 1:
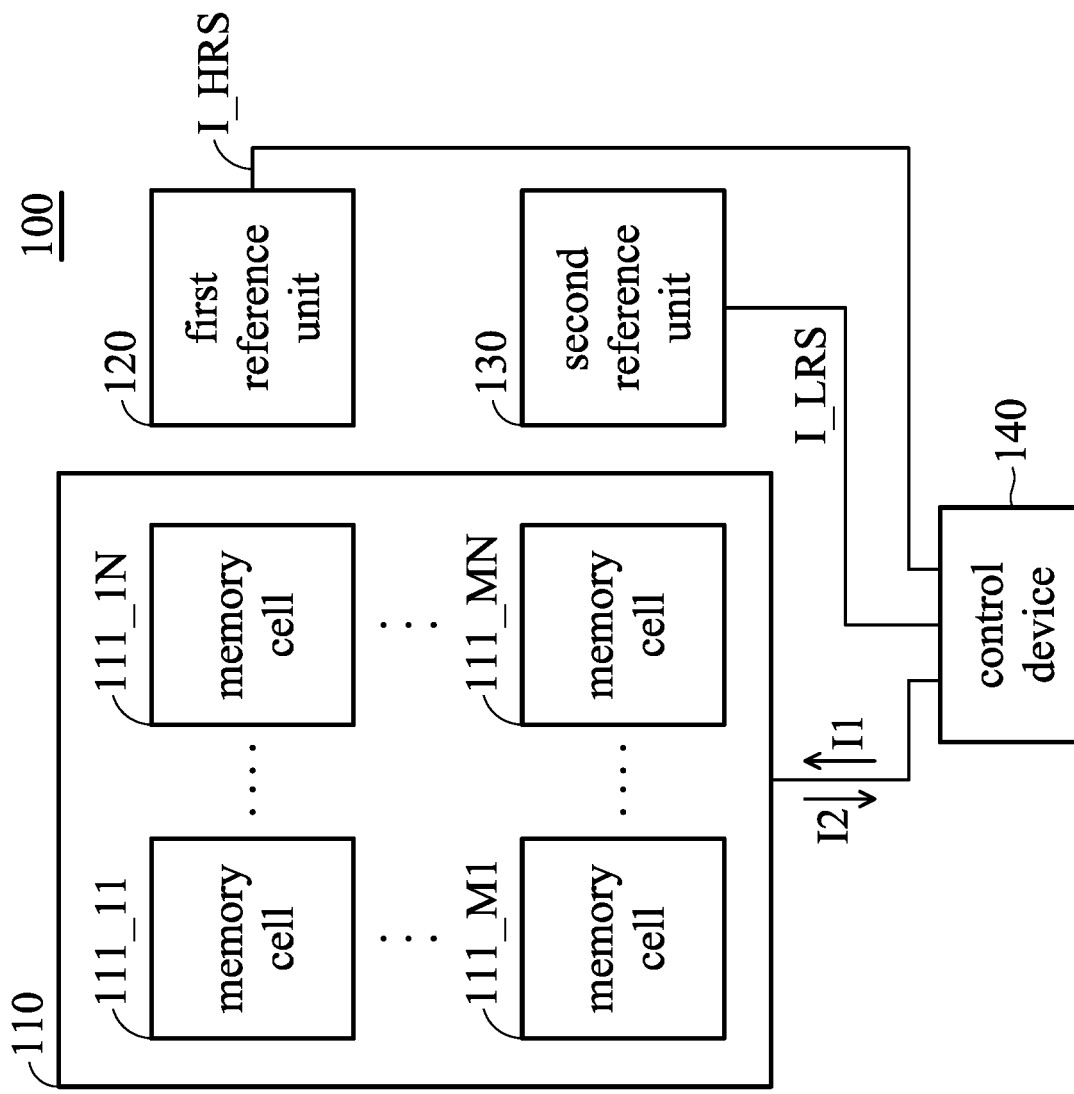
FIG. 1 is a schematic view of a memory device according to an embodiment of the present invention.

FIG. 1 is a schematic view of a memory device according to an embodiment of the present invention. Please refer to FIG. 1. The memory device 100 includes a memory array 110, a first reference unit 120, a second reference unit 130 and a control device 140.

Figure 2:
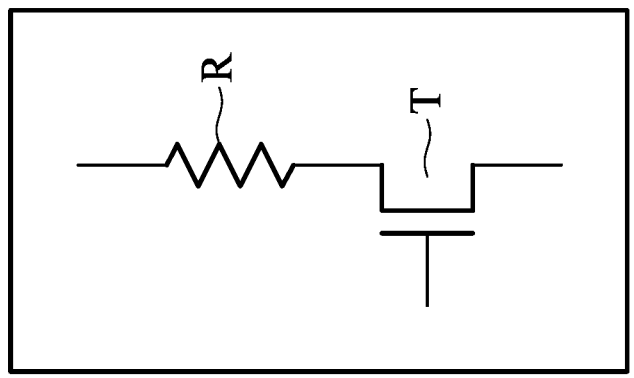
FIG. 2 is a schematic view of a memory cell, a first reference unit and a second reference unit according to an embodiment of the present invention.

The memory array 110 includes a plurality of memory cells 111_11~111_MN, wherein, N and M are positive integers greater than 1. In addition, N and M may be the same or different. In the embodiment, each of the memory cells 111_11~111_MN includes a resistor R and a transistor T, wherein the resistor R is coupled to the transistor, as shown in FIG. 2.

The first reference unit 120 provides a first reference current I_HRS. The second reference unit 130 provides a second reference current I_LRS, wherein a current value of the first reference current I_HRS is less than a current value of the second reference current I_LRS. In the embodiment, the first reference unit 120 and the second reference unit 130 may also include a resistor R and a transistor T, respectively, wherein the resistor R is coupled to the transistor T, as shown in FIG. 2.

In addition, the first reference unit 120 and the second reference unit 130 are disposed on the side of the memory array 110 or surrounding the memory array 110. The locations of the first reference unit 120 and the second reference unit 130 shown in FIG. 1 are one exemplary embodiment of the present invention, but the embodiment of the present invention is not limited thereto. The user may arrange the first reference unit 120 and the second reference unit 130 at different locations according to the design requirements, and the above locations are on the side of the memory array 110 or surrounding the memory array 110. Furthermore, the first reference unit 120 and the second reference unit 130 may be disposed on the same side or on different sides of the memory array 110. In the embodiment, sizes of the resistors R and the transistor T of the memory cells 111_11~111_MN, the first reference unit 120, and the second reference unit 130 are the same.

The controller unit 140 is coupled to the memory cells 111_11~111_MN, the first reference unit 120 and the second reference unit 130. In a data-writing operation, the control unit 140 provides a first current I1 to a memory cell, such as the memory cell 111_11. Then, the control unit 140 reads a second current I2 generated by the memory cell 111_11 in response to the first current I1, and selects to compare the second current I2 with the first reference current I_HRS or to compare the second current I2 with the second reference current I_LRS according to the data-writing state of the memory cell 111_1, so as to determine whether a data writing of the data writing state is successful.

Figure 3:
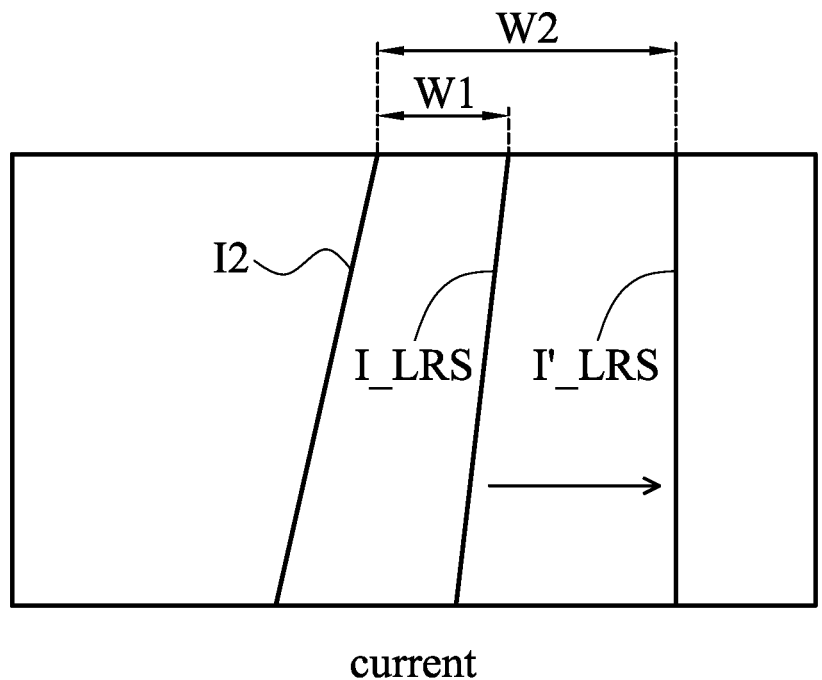
FIG. 3 is a schematic view of a sensing window between a second current and a second reference current when the data-writing state of a memory cell is a low logic level according to an embodiment of the present invention.

Furthermore, when the data-writing state of the memory cell 111_11 is a high logic level, it indicates that the data writing is 1. Then, the control unit 140 may select to compare the second current I2 with the second reference current I_LRS, so as to determine whether the data writing of the data writing state is successful. For example, as shown in FIG. 3, I2 is the second current, I_LRS is the second reference current, and W1 is a sensing window between the second current I2 and the second reference current I_LRS.

When the control unit 140 determines that the current value of the second current I2 is less than the current value of the second reference current I_LRS, the control unit 140 may determine that the data writing of the data-writing state is successful. That is, the data writing of the memory cell 111_11 is certainly 1. When the control unit 140 determines that the current value of the second current I2 is not less than the current value of the second reference current I_LRS, control unit 140 may determine that the data writing of the data-writing state is not successful. That is, the data writing of the memory cell 111_11 is not 1. The data-writing operations of the rest of the memory cells are the same as the data-writing operation of the memory cell 111_11, and the description thereof is not repeated herein.

In some embodiments, the size of the transistor T in the second reference unit 130 may be greater than the sizes of the transistors T in the memory cells 111_11~110_MN and the first reference unit 120. As such, the switching capability of the transistor T of the second reference unit 130 is increased. Therefore, the current provided by the second reference unit 130 changes to the second reference current I'_LRS from the second reference current I_LRS, and a length of a sensing window W2 between the second current I2 and the second reference current I'_LRS may be longer than a length of the sensing window W1 between the second current I2 and the second reference current I_LRS, as shown in FIG. 3. Therefore, the reliability and accuracy of the memory may be effectively increased.

Figure 4:
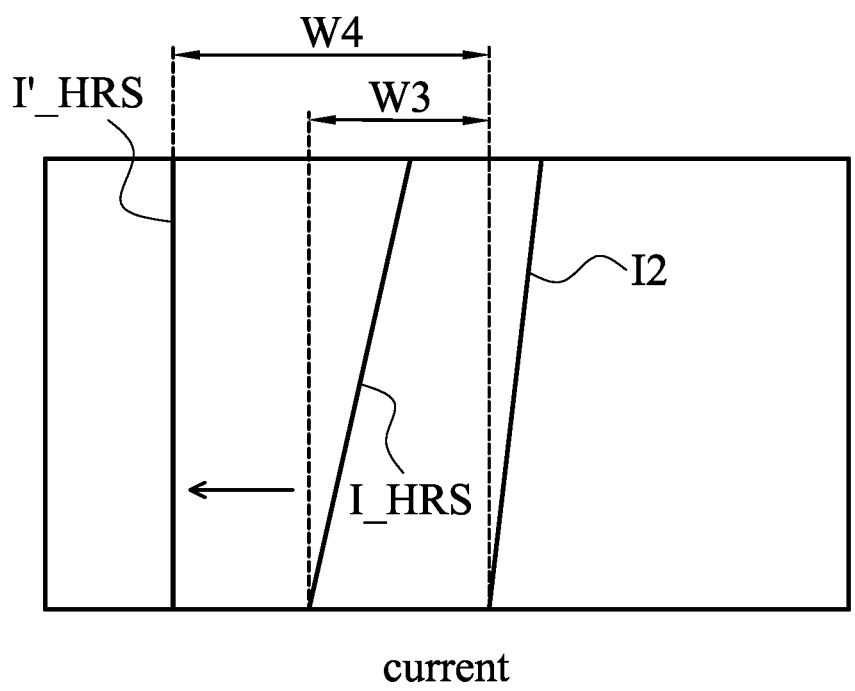
FIG. 4 is a schematic view of a sensing window between a second current and a first reference current when the data-writing state of a memory cell is a high logic level according to an embodiment of the present invention.

On the other hand, when the data-writing state of the memory cell 111_11 is a low logic level, it indicates that the data writing is 0. Then, the control unit 140 may select to compare the second current I2 with the first reference current I_HRS, so as to determine whether the data writing of the data writing state is successful. For example, as shown in FIG. 4, I2 is the second current, I_HRS is the first reference current, and W3 is a sensing window between the second current I2 and the first reference current I_HRS.

When the control unit 140 determines that the current value of the second current I2 is greater than the current value of the first reference current I_HRS, the control unit 140 may determine that the data writing of the data-writing state is successful. That is, the data writing of the memory cell 111_11 is certainly 0. When the control unit 140 determines that the current value of the second current I2 is not greater than the current value of the first reference current I_HRS, the control unit 140 may determine that the data writing of the data-writing state is not successful. That is, the data writing of the memory cell 111_11 is not 0.

In some embodiments, the size of the resistor R in the first reference unit 120 may be smaller than the sizes of the resistors R in the memory cells 111_11~111_MN and the second reference unit 130. Therefore, the current provided by the first reference unit 120 changes to the first reference current I'_HRS from the first reference current I_HRS, and a length of a sensing window W4 between the second current I2 and the first reference current I'_HRS may be longer than a length of the sensing window W3 between the second current I2 and the first reference current I_HRS, as shown in FIG. 4. Therefore, the reliability and accuracy of the memory may be increased more effectively.

In addition, in a data-reading operation, the control unit 140 reads the second current I2 corresponding to the memory cell (such as the memory cell 111_11), Then, the control unit 140 determines the logic level of the data-writing state of the memory cell according to the second current I2, the first reference current I_HRS, and the second reference current I_LRS.

In the embodiment, the control unit 140 determines whether the logic level is a high logic level or a low logic level according to the first difference value (such as I2−I_HRS) between the second current I2 and the first reference current I_HRS and the second difference value (such as I2−I_LRS) between the second current I2 and the second reference current I_LRS. Furthermore, the control unit 140 may compare an absolute value (such as |I2−I_HRS|) of the first difference value with an absolute value (such as |I2−I_LRS|) of the second difference value, so as to determine that the logic level is the high logic level or the low logic level.

For example, when the absolute value (such as |I2−I_HRS|) of the first difference value is greater than the absolute value (such as |I2−I_LRS|) of the second difference value, the control unit 140 determines that the data-writing state of the memory cell 111_11 is the low logic level.

When the absolute value (such as |I2−I_HRS|) of the first difference value is less than the absolute value (such as |I2−I_LRS|) of the second difference value, the control unit 140 determines that the data-writing state of the memory cell 111_11 is the high logic level.

That is, when performing the read operation on the memory cell, the control unit 140 may know the data-writing state of the memory cell in the above manner. Therefore, the convenience of use may be increased.

Figure 5:
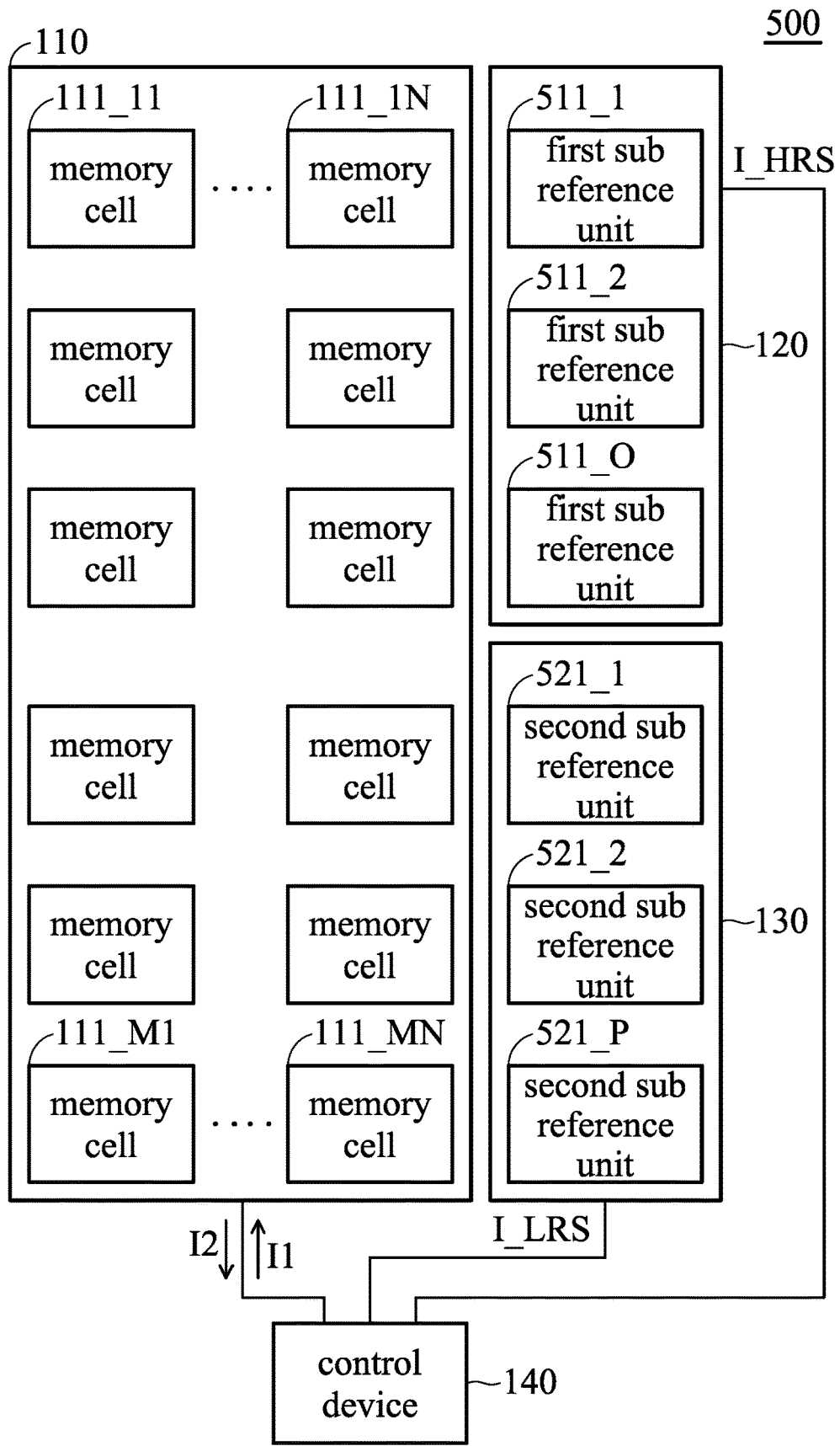
FIG. 5 is a schematic view of a memory device according to another embodiment of the present invention.

FIG. 5 is a schematic view of a memory device according to another embodiment of the present invention. Please refer to FIG. 5. The memory device 500 includes a memory array 110 a first reference unit 120, a second reference unit 130 and a control unit 140. The memory array 110 and the control unit 140 of FIG. 5 are the same as or similar to the memory array 110 and the control unit 140 of FIG. 1. Accordingly, the description of the memory array 110 and the control unit 140 of FIG. 5 may be deduced by analogy from the description of the embodiment of FIG. 1, and the description thereof is not repeated herein.

In the embodiment, the first reference unit 120 may include a plurality of first sub reference units 511_1..511_O for providing a plurality of first sub reference currents, wherein O is a positive integer greater than 1. In addition, the first reference unit 120 uses the median or the average value of the first sub reference currents above as the current value of the first reference current I_HRS.

The second reference current 130 may include a plurality of second sub reference units 521_~521_P for providing a plurality of second sub reference currents, wherein P is a positive integer greater than 1. In addition, the second reference unit 130 uses the median or the average value of the second sub reference currents above as the current value of the second reference current I_LRS.

In the embodiment, the number of first sub reference units 511_1~511_O and the number of second sub reference units 521_~521_P change according to the size of the memory array 110. In addition, the number of first sub reference units 511_1~511_O and the number of second sub reference units 521_~521_P is the same or different. That is, O and P may be the same or different.

Figure 6:
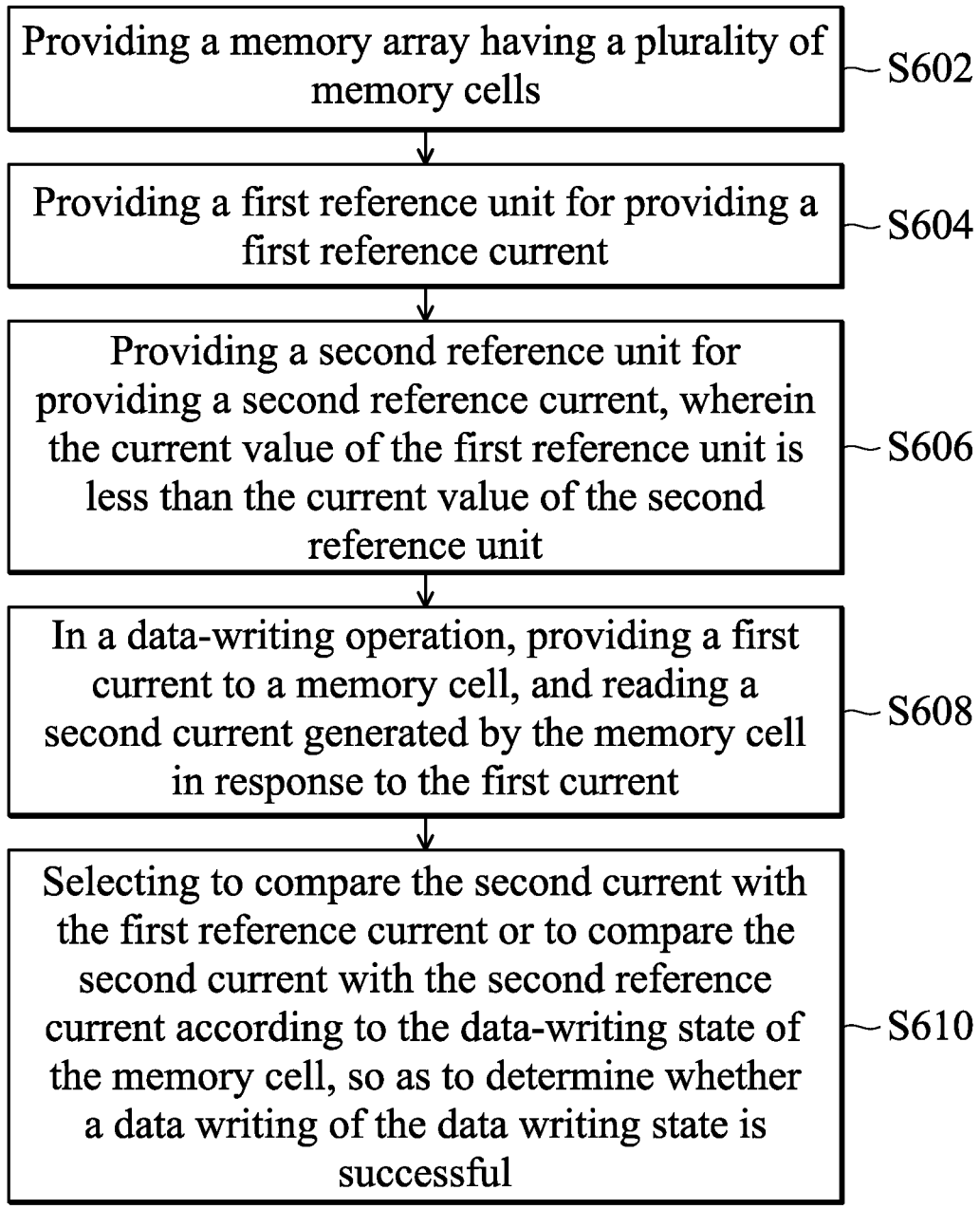
FIG. 6 is a flowchart of an operation method of a memory device according to an embodiment of the present invention.

According to the above-mentioned description, the present invention additionally provides an operation method of a memory device. FIG. 6 is a flowchart of an operation method of a memory device according to an embodiment of the present invention. In step S602, the method involves providing a memory array having a plurality of memory cells. In step S604, the method involves providing a first reference unit for providing a first reference current. In step S606, the method involves providing a second reference unit for providing a second reference current, wherein the current value of the first reference unit is less than the current value of the second reference unit.

In step S608, the method involves in a data-writing operation, providing a first current to a memory cell, and reading a second current generated by the memory cell in response to the first current. In step S610, the method involves selecting to compare the second current with the first reference current or to compare the second current with the second reference current according to the data-writing state of the memory cell, so as to determine whether a data writing of the data writing state is successful.

Furthermore, step S610 includes the following step. When the data-writing state of the memory cell is a low logic level, it is selected to compare the second current with the first reference current, so as to determine whether the data writing of the data writing state is successful. When the data-writing state of the memory cell is a high logic level, it is selected to compare the second current with the second reference current, so as to determine whether the data writing of the data writing state is successful. In addition, the first reference unit includes a plurality of first sub reference units for providing a plurality of first sub reference currents, and the first reference unit uses the median or the average value of the first sub reference currents as the current value of the first reference current. The second reference unit includes a plurality of second sub reference units for providing a plurality of second sub reference currents, and the second reference unit uses the median or the average value of the second sub reference currents as the current value of the second reference current.

Figure 7:
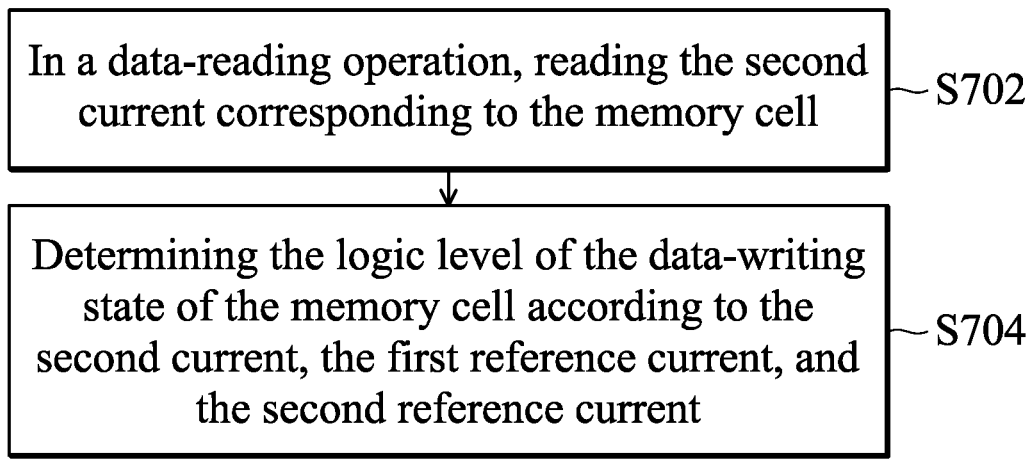
FIG. 7 is a flowchart of an operation method of a memory device according to another embodiment of the present invention.

FIG. 7 is a flowchart of an operation method of a memory device according to another embodiment of the present invention. In step S702, the method involves in a data-reading operation, reading the second current corresponding to the memory cell. In step S704, the method involves determining the logic level of the data-writing state of the memory cell according to the second current, the first reference current, and the second reference current. Furthermore, step S704 includes the following step. It is determined whether the data-writing state of the memory cell is the high logic level or the low logic level according to the absolute value of the first difference value between the second current and the first reference current and the absolute value of the second difference value between the second current and the second reference current. When the absolute value of the first difference value is greater than the absolute value of the second difference value, it is determined that the data-writing state of the memory cell is the low level. On the other hand, when the absolute value of the first difference value is less than the absolute value of the second difference value, it is determined that the data-writing state of the memory cell is the high logic level.

In summary, according to the memory device and the operation method thereof disclosed by the embodiment of the present invention, the first reference unit provides the first reference current, and the second reference unit provides the second reference current, wherein the current value of the first reference current is less than the current value of the second reference current. In the data-writing operation, the control unit may select to compare the second current with the first reference current or to compare the second current with the second reference current according to the data-writing state of the memory cell, so as to determine whether a data writing of the data writing state is successful. Therefore, the reliability and accuracy of the memory may be effectively increased. In addition, by changing the size of the resistor in the first reference unit and/or the size of the transistor in the second reference unit, the length of the sensing window may be increased, and the reliability and accuracy of the memory may be increased more effectively.

Furthermore, in the data-reading operation, the control unit reads the second current corresponding to the memory cell, and determines the logic level of the data-writing state of the memory cell according to the second current, the first reference current, and the second reference current. Therefore, after the data is written into the memory cell, the logic level of the data-writing state of the memory cell may be effectively known, and the convenience of use is increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   a memory array, having a plurality of memory cells;
   a first reference unit, configured to provide a first reference current;
   a second reference unit, configured to provide a second reference current, wherein a current value of the first reference current is less than a current value of the second reference current; and a control unit, coupled to the memory cells, the first reference unit and the second reference unit, wherein in a data-writing operation, the controller unit provides a first current to a memory cell, reads a second current generated by the memory cell in response to the first current, and the controller unit selects to compare the second current with the first reference current or to compare the second current with the second reference current according to a data-writing state of the memory cell, so as to determine whether a data writing of the data writing state is successful.

2. The memory device as claimed in claim 1, wherein when the data-writing state of the memory cell is a low logic level, the controller unit selects to compare the second current with the first reference current, so as to determine whether the data writing of the data writing state is successful, and when the data-writing state of the memory cell is a high logic level, the control unit selects to compare the second current with the second reference current, so as to determine whether the data writing of the data writing state is successful.

3. The electronic device as claimed in claim 1, wherein the first reference unit and the second reference unit are disposed on the side of the memory array or surrounding the memory array.

4. The memory device as claimed in claim 1, wherein the first reference unit comprises a plurality of a first sub reference units for providing a plurality of first sub reference currents, the first reference unit uses a median or an average value of the first sub reference currents as the current value of the first reference current, and the second reference unit comprises a plurality of second sub reference units for providing a plurality of second sub reference currents, and the second reference unit uses a median or an average value of the second sub reference currents as the current value of the second reference current.

5. The memory device as claimed in claim 1, wherein each of the memory cells, the first reference unit, and the second reference unit comprise a resistor and a transistor, and the resistor is coupled to the transistor.

6. The memory device as claimed in claim 5, wherein a size of the resistor in the first reference unit is less than sizes of the resistors in the memory cells and the second reference unit.

7. The memory device as claimed in claim 5, wherein a size of the transistor in the second reference unit is greater than sizes of the transistors in the memory cells and the first reference unit.

8. The memory device as claimed in claim 1, wherein in a data-reading operation, the control unit reads the second current corresponding to the memory cell, and determines a logic level of the data-writing state of the memory cell according to the second current, the first reference current, and the second reference current.

9. The memory device as claimed in claim 8, wherein the control unit determines whether the logic level is a high logic level or a low logic level according to a first difference value between the second current and the first reference current and a second difference value between the second current and the second reference current.

10. An operation method of a memory device, comprising:
providing a memory array having a plurality of memory cells;
providing a first reference unit for providing a first reference current;
providing a second reference unit for providing a second reference current, wherein a current value of the first reference unit is less than a current value of the second reference unit;
in a data-writing operation, providing a first current to a memory cell, and reading a second current generated by the memory cell in response to the first current; and
selecting to compare the second current with the first reference current or to compare the second current with the second reference current according to a data-writing state of the memory cell, so as to determine whether a data writing of the data writing state is successful.

11. The operation method of the memory device as claimed in claim 10, wherein the step of selecting to compare the second current with the first reference current or to compare the second current with the second reference current according to the data-writing state of the memory cell, so as to determine whether the data writing of the data writing state is successful comprises:
when the data-writing state of the memory cell is a low logic level, selecting to compare the second current with the first reference current, so as to determine whether the data writing of the data writing state is successful; and
when the data-writing state of the memory cell is a high logic level, selecting to compare the second current with the second reference current, so as to determine whether the data writing of the data writing state is successful.

12. The operation method of the memory device as claimed in claim 10, wherein the first reference unit comprises a plurality of a first sub reference units for providing a plurality of first sub reference currents, the first reference unit uses a median or an average value of the first sub reference currents as the current value of the first reference current, and the second reference unit comprises a plurality of second sub reference units for providing a plurality of second sub reference currents, and the second reference unit uses a median or an average value of the second sub reference currents as the current value of the second reference current.

13. The operation method of the memory device as claimed in claim 10, further comprising:
in a data-reading operation, reading the second current corresponding to the memory cell; and
determining a logic level of the data-writing state of the memory cell according to the second current, the first reference current, and the second reference current.

14. The operation method of the memory device as claimed in claim 13, wherein the step of determining the logic level of the data-writing state of the memory cell according to the second current, the first reference current, and the second reference current comprises:
determining whether the logic level is a high logic level or a low logic level according to the first difference value between the second current and the first reference current and the second difference value between the second current and the second reference current.

* * * * *